US009739861B2

(12) United States Patent
Smith et al.

(10) Patent No.: US 9,739,861 B2
(45) Date of Patent: Aug. 22, 2017

(54) METHOD FOR REDUCED FIELD OF VIEW MRI IN AN INHOMOGENEOUS FIELD WITH RAPID OUTER VOLUME SUPPRESSION

(71) Applicants: Travis B. Smith, Lake Oswego, OR (US); Krishna S. Nayak, Los Angeles, CA (US)

(72) Inventors: Travis B. Smith, Lake Oswego, OR (US); Krishna S. Nayak, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 1131 days.

(21) Appl. No.: 13/865,796

(22) Filed: Apr. 18, 2013

(65) Prior Publication Data

US 2013/0278258 A1  Oct. 24, 2013

Related U.S. Application Data

(60) Provisional application No. 61/635,451, filed on Apr. 19, 2012.

(51) Int. Cl.
  *G01V 3/00* (2006.01)
  *G01R 33/56* (2006.01)
  *G01R 33/483* (2006.01)
  *G01R 33/561* (2006.01)

(52) U.S. Cl.
  CPC ......... *G01R 33/56* (2013.01); *G01R 33/4838* (2013.01); *G01R 33/561* (2013.01)

(58) Field of Classification Search
  CPC ... G01R 33/56; G01R 33/4838; G01R 33/561
  USPC ....................................................... 324/309
  See application file for complete search history.

(56) References Cited

U.S. PATENT DOCUMENTS

| 4,891,595 | A | 1/1990 | Granot | |
|---|---|---|---|---|
| 5,124,650 | A | 6/1992 | Granot | |
| 6,353,752 | B1 | 3/2002 | Madore et al. | |
| 6,384,601 | B1 | 5/2002 | Wiesler et al. | |
| 6,522,139 | B1 * | 2/2003 | Thompson | G01R 33/5615 324/306 |
| 7,020,509 | B2 * | 3/2006 | Heid | G01R 33/561 324/308 |
| 7,064,545 | B2 * | 6/2006 | Zaharchuk | G01R 33/563 324/307 |
| 7,148,686 | B2 * | 12/2006 | Asano | G01R 33/4828 324/309 |
| 7,514,923 | B2 | 4/2009 | Zhao | |
| 7,627,359 | B2 * | 12/2009 | Yarnykh | G01R 33/5607 324/307 |

(Continued)

OTHER PUBLICATIONS

Deng, W. et al. 2010. A three-dimensional variable-density spiral spatial-spectral RF pulse with rotated gradients, Magn Reson Med 2010, No. 63:828-834.

(Continued)

*Primary Examiner* — Susan Lee
(74) *Attorney, Agent, or Firm* — Snell & Wilmer LLP

(57) ABSTRACT

An MRI scanner may include one or more gradient waveform generators, gradient amplifiers, gradient coils, an RF waveform generator, an RF amplifier, an RF coil, a superconducting magnet, an RF detector; a digitizer, and a computer system that controls the one or more gradient waveform generators and the RF waveform generator so as to generate a magnetization saturation preparation pulse sequence that includes a tip-down pulse that is insensitive to RF field inhomogeneity followed by a tip-back pulse that employs a conjugate symmetry constraint in its energy spectrum.

19 Claims, 11 Drawing Sheets
(4 of 11 Drawing Sheet(s) Filed in Color)

(56) References Cited

U.S. PATENT DOCUMENTS

| | | | |
|---|---|---|---|
| 7,723,987 B2 | 5/2010 | Bito et al. | |
| RE44,644 E * | 12/2013 | Mugler, III | 324/307 |
| 2003/0144587 A1 | 7/2003 | Ma et al. | |
| 2006/0284615 A1* | 12/2006 | Nazafat | G01R 33/5635 324/307 |
| 2007/0279056 A1* | 12/2007 | Shankaranarayanan | A61B 5/055 324/309 |
| 2008/0004518 A1* | 1/2008 | Stehning | G01R 33/50 600/410 |
| 2008/0275329 A1* | 11/2008 | Reeder | G01R 33/56341 600/410 |
| 2009/0143666 A1* | 6/2009 | Edelman | A61B 5/055 600/410 |
| 2012/0194186 A1* | 8/2012 | Rehwald | G01R 33/5602 324/309 |

OTHER PUBLICATIONS

Le Roux, P.H. et al. 1998. Optimized outer volume suppression for single-shot fast spin-echo cardiac imaging. J Magn Reson Imag 1998; 8:1022-1032.

Luo, Y. et al. 2001. BISTRO: an outer volume suppression method that tolerates RF field inhomogeneity. Magn Reson Med 2001;45:1095-1102.

Pisani, L. et al. 2007. Restricted field of view magnetic resonance imaging of a dynamic time series. Magn Reson Med 2007;57:297-307.

Schaeffter, T. et al. 2001. Interactive reduced FOV imaging for projection reconstruction and spiral acquisition. Magn Reson Imag 2001; 19:677-684.

Schaer, M. et al. 2010. Simultaneous B0– and B1+-map acquisition for fast localized shim, frequency, and RF power determination in the heart at 3T. Magn Reson Med 2010; 63(2):419-426.

Staewen, R.E., et al. 1990. 3-D FLASH imaging using a single surface coil and a new adiabatic pulse, BIR-4. Investigative Radiology 1990; 25(5):559-567.

Tannus, A. et al. 1997. Adiabatic pulses. NMR in Biomed 1997;10:423-434.

Wilm, B.J. et al. 2007. Reduced field-of-view MRI using outer volume suppression for spinal cord diffusion imaging. Magn Reson Med 2007; 57:625-630.

* cited by examiner

METHOD FOR REDUCED FIELD OF VIEW MRI IN AN INHOMOGENEOUS FIELD WITH RAPID OUTER VOLUME SUPPRESSION

CROSS-REFERENCE TO RELATED APPLICATION

This application is based upon and claims priority to U.S. provisional patent application 61/635,451, entitled "METHOD FOR REDUCED FIELD OF VIEW MRI IN AN INHOMOGENEOUS FIELD WITH RAPID OUTER VOLUME SUPPRESSION," filed Apr. 19, 2012, the entire content of which is incorporated herein by reference.

BACKGROUND

Technical Field

This disclosure relates to magnetic resonance imaging (MRI).

Description of Related Art

Spatial aliasing may occur in an magnetic resonance (MR) image if the k-space sample spacing is not fine enough to support the full spatial extent of the received signal. This sampling criterion may become burdensome and inefficient when the region of interest (ROI) is small relative to the full spatial extent of the anatomy. With reduced or restricted field-of-view (rFOV) imaging, efficiency may be improved. In an rFOV acquisition, the prescribed FOV may be decreased to more closely match the ROI size, thereby permitting shorter readout durations ($T_{read}$), fewer k-space segments, or both. The time savings can be leveraged for faster acquisitions, improved tolerance to artifacts from motion or off resonance, finer spatial resolution, and/or better coverage.

rFOV techniques may employ outer volume suppression (OVS), a spatial pre-saturation sequence which attenuates signal outside the ROI and serves as a spatial anti-aliasing filter. Energy along the readout direction may be suppressed by hardware filters, so typically OVS may be applied to reduce signal along the direction(s) orthogonal to the readout. Compared to multi-dimensional excitation pulses, whose long durations can negate the time-efficiency benefit of an rFOV acquisition, Stenger A V, Boada F E, Noll D C *Multishot 3D slice-select tailored RF pulses for MRI*, Magn Reson Med 2002, No. 48:157-168; Deng W, Stenger V A, *A three-dimensional variable-density spiral spatial-spectral RF pulse with rotated gradients*, Magn Reson Med 2010, No. 63:828-834, OVS preparations may be applied prior to a set of readout intervals (TR) and may provide more design flexibility.

OVS sequences may be effective only at lower field strengths (≤1.5 T) due to their sensitivity to $B_1+$ inhomogeneity, or have long durations that may preclude their utilization in cardiac and other rapid imaging applications. Dynamic radial acquisitions with REST, which uses cosine-modulated saturation pulses to reduce the FOV orthogonal to each spoke, has been applied in 1.5 T cardiac imaging. However, this method may not be not suitable for spiral imaging, may need to be applied once each TR interval, and may be $B_1+$ sensitive.

A faster, single-sided OVS design, which ca be used in rapid single-shot spin-echo cardiac imaging, may also not be robust to $B_1+$ variation. The BISTRO method may be capable of 2D OVS with improved $B_1+$ field insensitivity, but its duration may be over 200 msec. A 1D OVS design may be used for spinal cord diffusion imaging at 3 T. However, the duration may be almost 100 msec due to the need for multiple quadratic-phase pulses.

Pisani, et al. used a rapid OVS sequence for functional MRI of the fetal brain at 1.5 T. The OVS design consists of a long 2D spatially selective spiral tipdown pulse, followed by a $B_1+$-insensitive adiabatic half-passage tipback pulse and spoiler gradients. The sequence may suppress signal outside of a cylindrical ROI, and may be suited for multi-slice spiral or radial imaging.

SUMMARY

An MRI scanner may include one or more gradient waveform generators that generate one or more gradient waveforms; gradient amplifiers that each amplify one of the gradient waveforms; gradient coils that each generate a magnetic field based on an amplified gradient waveform; an RF waveform generator that generates an RF waveform; an RF amplifier that amplifies the RF waveform; an RF coil that transmits the amplified RF waveform; a superconducting magnet that generates a detectable signal; an RF coil that receives the detectable signal; an RF detector that detects the detectable signal received by the RF coil; a digitizer that digitizes the detected signal; and a computer system that controls the one or more gradient waveform generators and the RF waveform generator so as to generate a magnetization saturation preparation pulse sequence that includes a tip-down pulse that is insensitive to RF field inhomogeneity followed by a tip-back pulse that employs a conjugate symmetry constraint in its energy spectrum.

The computer system may control the one or more gradient waveform generators and the RF waveform generator so as to produce an outer volume suppression sequence with a spatially selective tip-back pulse that has the conjugate symmetry constraint in its energy spectrum. The outer volume suppression pulse sequence may have a duration of no more than 12.5 milliseconds with a two-sided stopband width of 44.0 centimeters and a two-sided passband width of 5.0 centimeters.

The computer system may control the one or more gradient waveform generators and the RF waveform generator so as to produce a spectrally selective tip-back pulse that has the conjugate symmetry constraint in its energy spectrum.

Non-transitory, tangible, computer-readable storage media containing a program of instructions may cause the computer system to perform one or more of the functions recite herein.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps. The patent or application file contains at least one drawing executed in color. Copies of this patent or patent application publication with color

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

An outer volume suppression (OVS) design may be suitable for multi-slice cardiovascular spiral imaging at 3 T. Cardiovascular imaging may be archetypal of the need for rFOV acquisitions. For example, fine resolution may be required for coronary artery imaging, yet resolution is limited because most of the acquisition time must be spent avoiding aliasing from the surrounding anatomy. At 3 T and higher field strengths, where increased SNR can be traded for finer resolution, effective OVS may be challenging due to the greater inhomogeneities in the RF transmit ($B_1$+) field and main magnetic ($B_0$) field. Furthermore, with cardiac imaging and other time-sensitive protocols, there may be a strong incentive to keep the duration of the OVS sequence to a minimum.

A 2D OVS preparation sequence may addresses the challenges of rFOV imaging at 3 T. The sequence may use an adiabatic pulse and a spiral pulse to achieve OVS with a cylindrical ROI, similar to Pisani L, Bammer R, Glover G. *Restricted field of view magnetic resonance imaging of a dynamic time series*, Magn Reson Med 2007, No. 57:297-307. However, the tipdown pulse may be adiabatic and the tipback pulse may be spatially selective. As discussed below, tipback pulses can be significantly shorter than the more conventional tipdown pulses. The duration of the tipdown and tipback pulses may be 10.2 msec, which may be 19% shorter than another 1.5 T OVS design. Also, the design may be more robust to $B_1$+ inhomogeneity and may have a larger saturation bandwidth for improved suppression performance at 3 T. A $B_1$-insensitive rotation type 4 (BIR-4) tipdown pulse may be used. See Staewen R S, Johnson A J, Ross B D, Parrish T, Merkle H, Garwood M, *3-D FLASH imaging using a single surface coil and a new adiabatic pulse, BIR-4*, Invest Radiol 1990, No. 25:559-567. For a fixed RF power, BIR-4 pulses may have larger bandwidth than half-passage pulses, see Garwood M, Ke Y, *Symmetric pulses to induce arbitrary flip angles with compensation for RF inhomogeneity and resonance offsets*, J Magn Reson 1991, No. 94(3): 511-525, which may increase suppression bandwidth and decreases the sensitivity to $B_0$ field variation.

Methods

—OVS Design and Performance Measures

Figure 1A:
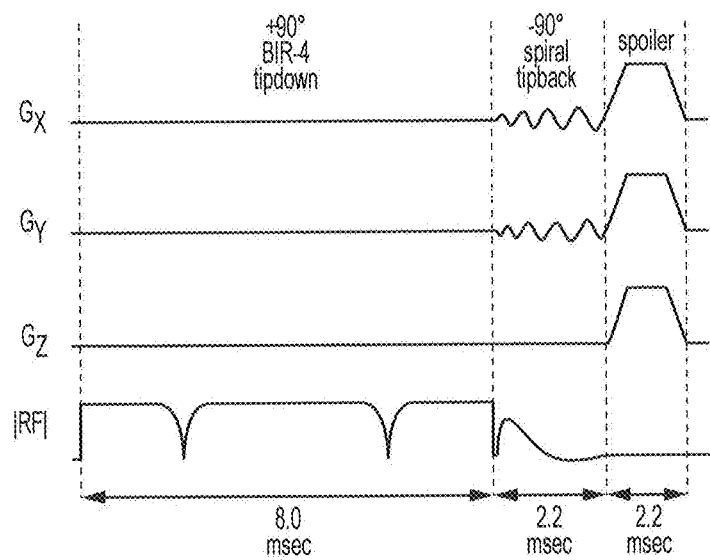
FIG. 1A illustrates a diagram of an outer volume suppression (OVS) pulse sequence.
Figure 1B:
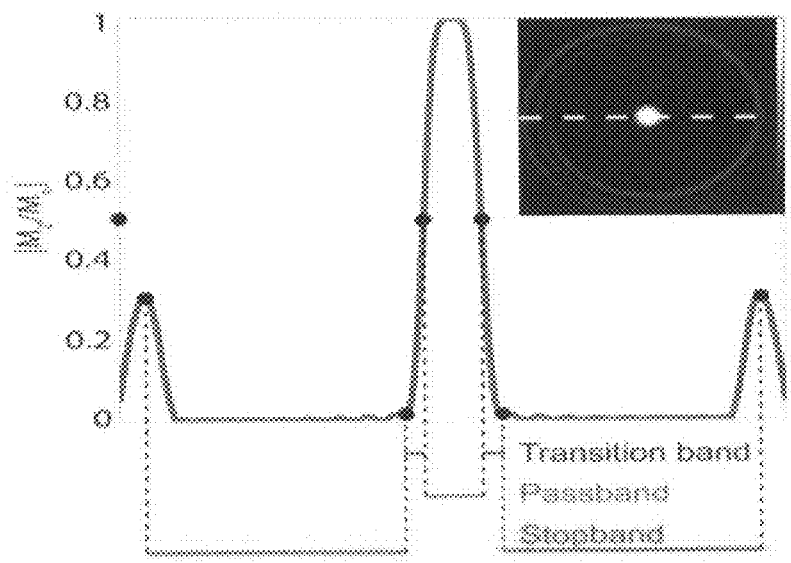
FIG. 1B illustrates a spatial profile of longitudinal magnetization (along the dashed line in the inset 2D profile) after OVS preparation.

FIG. 1A illustrates a diagram of an OVS pulse sequence, which may consist of a non-selective adiabatic tipdown pulse followed by a spatially selective tipback pulse. FIG. 1B illustrates a spatial profile of longitudinal magnetization (along the dashed line in the inset 2D profile) after OVS preparation.

An OVS pulse sequence may consist of a non-selective adiabatic tipdown ($+90_x°$) pulse followed by a 2D spatially selective tipback ($-90_x°$) pulse and dephasing gradients, as shown in FIG. 1A. The tipdown pulse may rotate the longitudinal magnetizations of all spins in the scanning volume into the transverse plane. The tipback pulse may then rotate spins within a cylindrical beam ROI back to a longitudinal orientation. Soiler gradients may dephase the remaining transverse signal outside the ROI. The total duration of the OVS sequence may be 12.4 msec. The spatial profile of the longitudinal magnetization after OVS preparation is depicted in FIG. 1B.

Figure 2A:
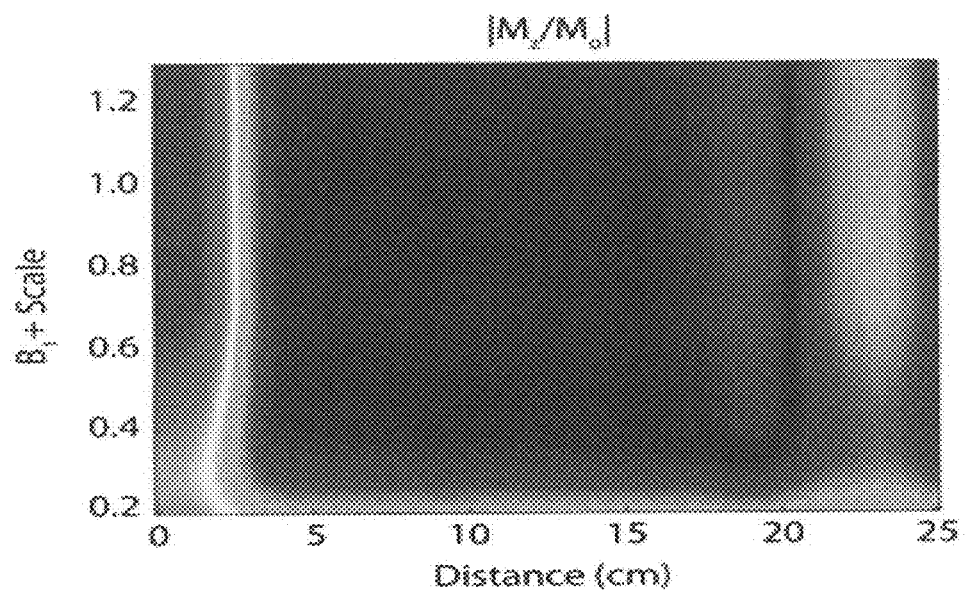
FIG. 2A illustrates simulated longitudinal magnetization after OVS on resonance.
Figure 2B:
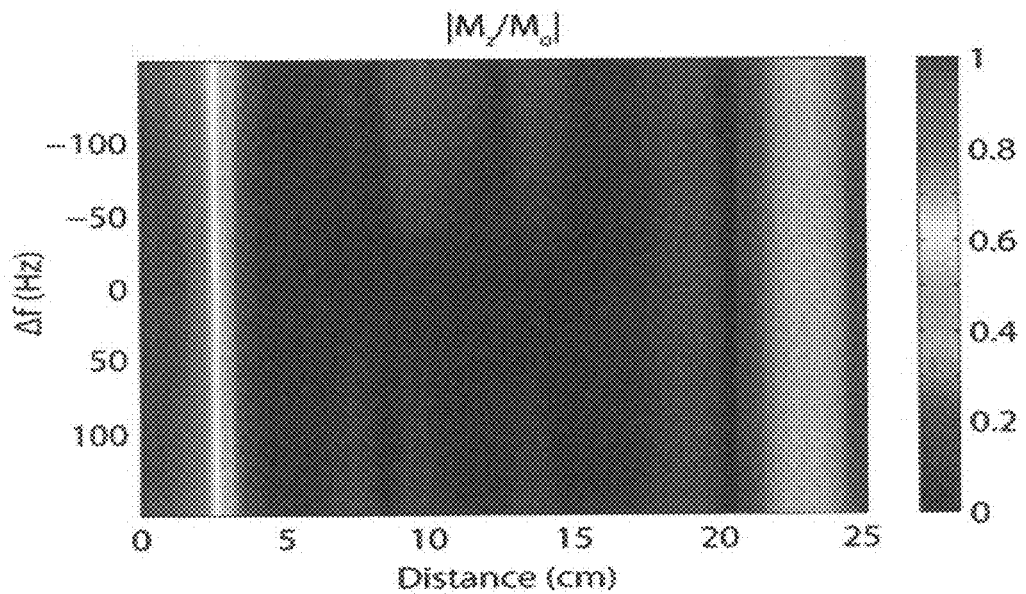
FIG. 2B illustrates the off resonance performance.

FIGS. 2A and B illustrate simulated longitudinal magnetization after OVS preparation and demonstrates robustness of the sequence. They show simulated performance of the OVS sequence across varying $B_1$+ scale factors and resonance frequency offsets. Distance |r| is from the center of the OVS region of interest. The passband is |r|<2.5 cm, and the stopband is 4 cm<|r|<20 cm. FIG. 1A illustrates on resonance ($\Delta f$=0 Hz) performance with varying B1+ scale. FIG. 2B illustrates off resonance performance with B1+ scale=1.0.

The OVS passband, stopband, and transition regions are defined in FIG. 1B. One measure of OVS performance is the stopband attenuation, defined as the ratio of stopband signal energy after OVS preparation to the energy with no preparation. Stopband attenuation, which may impact the signal-to-noise ratio (SNR) within the ROI when the FOV is reduced, may be primarily determined by the adiabatic tipdown pulse.

For spiral rFOV imaging, another OVS performance measure may be relative efficiency, defined as $$\text{relative efficiency} = \frac{\mu_{OVS}}{\mu_{Baseline}}, \quad [1]$$

where $\mu = SNR/(\rho^2 \sqrt{T_{acq}})$ is the SNR efficiency. The relative efficiency may be the additional passband SNR loss after accounting for changes in acquisition time ($T_{acq}$) and image resolution ($\rho$), as compared to a full FOV baseline image without OVS preparation. Assume that for both the baseline and OVS acquisitions, TR>>$T_1$ and the echo times (TE) are identical. When all imaging parameters are identical between the baseline and OVS scans, the relative efficiency may become a measure of passband attenuation.

Tipdown Pulse Design

For $B_1$+ robust suppression, an 8.0 msec +90° BIR-4 tipdown pulse, see Staewen R S, Johnson A J, Ross B D, Parrish T, Merkle H, Garwood M, *3-D FLASH imaging using a single surface coil and a new adiabatic pulse, BIR-4*, Invest Radiol 1990, No. 25:559-567, may be used with hyperbolic tangent and tangent functions for the amplitude and frequency modulations ($\beta$=10, tan($\lambda$)=130) and a peak RF amplitude of 0.16 G. To preserve passband signal, the tipback pulse may be coherent with the passband transverse magnetization. Variation in the local $B_1$+ and $B_0$ fields creates dispersion of the transverse magnetization phase, lowering the relative efficiency through unwanted stopband signal and incomplete tipback of the passband signal. The BIR-4 design parameters were chosen to maximize coherence and minimize the phase dispersion, defined as the difference between the maximum and minimum transverse phase, while maintaining an average suppression of $0.99M_o$ across simulated $B_1+$ scales from 0.5 to 1.0 and resonance offsets from −100 Hz to 100 Hz. These ranges represent the expected operational environment within the OVS passband for rFOV cardiovascular imaging. The OVS tipdown pulse has a phase dispersion of 42.9° over this range, and a bandwidth of approximately 680 Hz.

Tipback Pulse Design

A 2.2 msec −90° 2D spiral pulse, see Pauly J, Nishimura D, Macovski A, *A k-space analysis of small-tip-angle excitation*, J Magn Reson 1989, No. 81(1):43-56, for tipback may be used with a cylindrical spatial profile, with time-bandwidth product of 4.0 and gradients spiraling outward to avoid passband attenuation due to $T_2^*$ decay. No rephasing lobe may be necessary because all residual transverse magnetization may be gradient spoiled. The passband width is 5 cm, which may be small enough to offer significant rFOV imaging benefits but still large enough both to image most vessels even with substantial variation in breath-hold positioning and to tolerate modest gradient delays. The two-sided stopband width is 44 cm, which may be large enough to accommodate most body sizes and scan plane orientations. Gradients can be scaled to adjust the passband width (and transition and stopband widths) as necessary, provided hardware limits are not exceeded.

Figure 3:
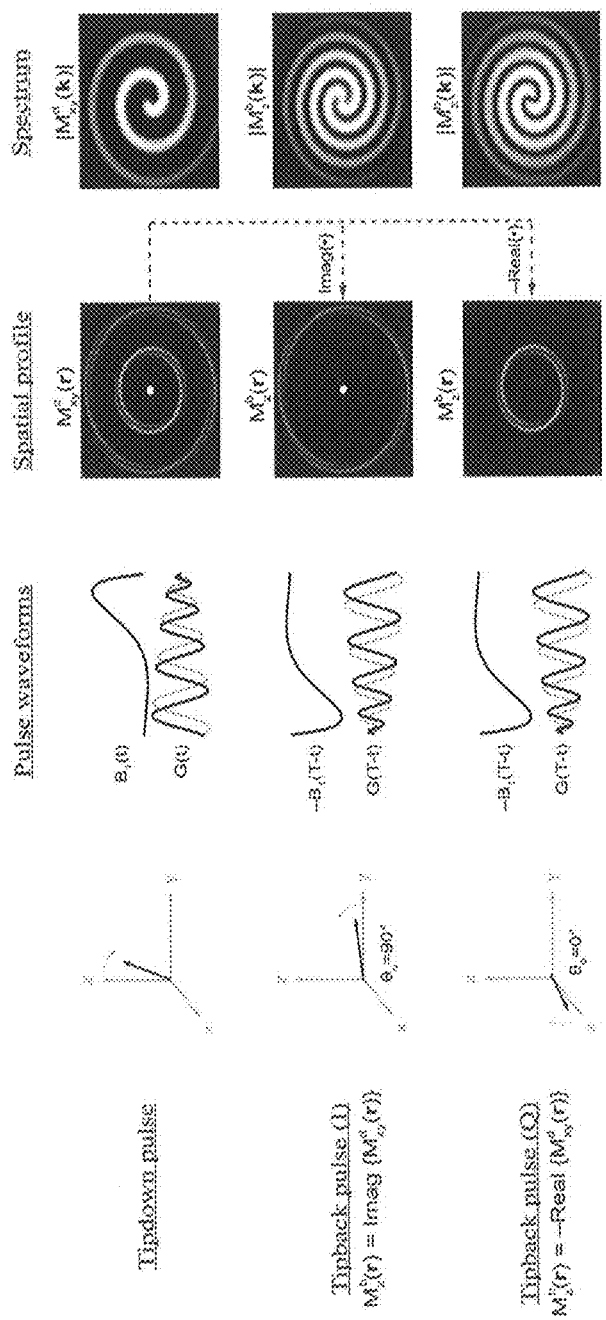
FIG. 3 illustrates the relationship between a tipdown spatial profile and a tipback spatial profile for a simulated spiral pulse applied along $\hat{x}$.

FIG. 3 illustrates the relationship between the tipdown spatial profile, $M_{xy}^d(r)$, and the tipback spatial profile, $M_z^b(r)$ for a simulated spiral pulse applied along $\hat{x}$. For any small-tip pulse, the tipback profile may be equivalent to a weighted combination of the real and imaginary components of the tipdown profile. The weights may depend on the tipback RF phase and on $\theta_o$, the phase of the initial transverse magnetization. Due to conjugate-symmetry, the spectrum of the spiral tipback pulse may contain a second interleaf, which may double the distance between sidelobes in the spatial profile. This additional performance is exchanged for shorter pulse duration to reduce the duration of the OVS sequence.

Unlike a conventional spiral excitation pulse, the single-shot tipback pulse may have the effective performance of a two-shot pulse. The second spiral interleaf may be generated by the rotation from the 2D transverse plane to the 1D longitudinal axis. The real-valued spatial profile of the longitudinal magnetization after a tipback pulse may correspond to symmetric constraint in k-space. This phenomenon can be described in terms of the coupling between the spatial profiles of a conventional excitation (tipdown) pulse and a tipback pulse, which holds for all small-tip pulses (see below). The spatial profile of a tipdown pulse, $M_{xy}^d(r)$, with initial longitudinal magnetization $M_o$ may be related to the corresponding tipback pulse spatial profile, $M_z^b(r)$, through $$M_z^b(r) = -\cos\theta_o Re\{M_{xy}^d(r)\} + \sin\theta_o Im\{M_{xy}^d(r)\}, \quad [2]$$

where $M_o e^{j\theta_o}$ is the initial transverse magnetization prior to the tipback pulse (Appendix A). The tipback spatial profile may be a combination of the tipdown real and imaginary components, which may exhibit conjugate symmetry and anti-symmetry, respectively, in excitation k-space. See Oppenheim A V, Schafer R W, Buck J R, *Discrete-time signal processing*, Upper Saddle River, N.J., Prentice-Hall, 1999. The symmetry constrains the k-space energy distribution and, for spiral pulses, establishes a second interleaf as shown in FIG. 3.

The imaginary component may contain the mainlobe and even sidelobes while the real component may contain only the odd sidelobes. The tipback pulse may be in phase with component containing the mainlobe. The imaginary component may therefore be referred to as the in-phase (or I) signal and the real component as the quadrature (or Q) signal. By proper tuning of the tipback RF phase, the I signal can be selected—which may effectively have twice the stopband width.

This additional performance may be leveraged for shorter pulse duration. A shorter pulse may reduce $T_2^*$ decay in the passband and limit $T_1$ recovery in the stopband. To shorten the pulse, the gap between two spiral arms may be increased until the desired stopband width is reached while satisfying hardware and safety constraints on the maximum gradient slew rate and peak RF amplitude. The 2.2 msec tipback pulse in the subject OVS sequence may have 1.95 times shorter duration than a conventional tipdown pulse with an equivalent spatial profile.

Imaging Experiments

All experiments were performed on a Signa Excite HD 3 T system (GE Healthcare, Waukesha, Wis.) with maximum gradient amplitude 40 mT/m and slew rate 150 T/m/sec. All acquisitions used body coil transmission and an 8-channel phased array cardiac coil for reception. Parallel imaging was not used.

To calibrate the OVS sequence, $B_0$ and $B_1+$ maps were acquired in a breath-hold using the simultaneous multi-slice mapping approach in, see Schär M, Vonken E J, Stuber M, *Simultaneous B0- and B1+-map acquisition for fast localized shim, frequency, and RF power determination in the heart at 3 T*, Magn Reson Med 2010, No. 63(2):419-426. Average values were calculated within a circular ROI representing the passband at the center of each map. The scanner center frequency was adjusted to compensate for frequency offsets. The transverse magnetization phase was estimated from the average $B_1+$ scale using a lookup table of BIR-4 Bloch simulation results. The tipback RF phase was set to this value to isolate the I signal, and the tipback amplitude was adjusted to mitigate $B_1+$ scaling.

Once the OVS sequence was calibrated, full FOV and rFOV imaging were performed using 2D multi-slice spoiled gradient echo acquisitions with uniform-density 16-shot spiral trajectories and spectral spatial RF excitation, see Meyer C H, Pauly J M, Macovski A, Nishimura D G, *Simultaneous spatial and spectral selective excitation*, Magn Reson Med 1990, No. 15(2):287-304. All acquisitions had a 50° flip angle and 2.0 msec TE. Artificial gating was used for phantom acquisitions, and ECG gating was used for in vivo scans. One spiral shot was acquired each heartbeat (R-R interval) per slice, and the TR for each slice varied between 750 and 1000 msec depending on the R-R interval time. The OVS preparation was applied once each R-R interval immediately prior to the first slice-selective excitation pulse. Images were reconstructed on the scanner with compiled Matlab (Mathworks, Natick, Mass.) software using gridding with Jacobian density compensation, see Hoge R D, Kwan R K, Pike G B, *Density compensation functions for spiral MRI*, Magn Reson Med 1997, No. 38(1):117-128. Image analysis and calculations of efficiency and stopband attenuation were performed offline using Matlab.

OVS validation experiments were performed using a 27 cm diameter doped-water ball phantom ($T_1$=190 msec, $T_2$=30 msec) and a standard resolution phantom ($T_1$=250 msec, $T_2$=20 msec). In vivo performance was assessed with rFOV cross-sectional imaging of the descending aorta (DAo) and a linear segment of the right coronary artery (RCA) in two healthy volunteers. Both subjects were screened for MRI risk factors and provided informed consent in accordance with institutional policy. Three adjacent slices were acquired in each acquisition.

Imaging parameters for SNR comparisons among experiments are shown in Table 1:

TABLE 1

| Subject | Acquisition type | FOV (cm) | ρ (mm) | $T_{read}$ (msec) | $T_{acq}$ (msec) | Slice thickness (mm) | FIG. |
|---|---|---|---|---|---|---|---|
| Ball phantom | 1. Full FOV | 36 | 3.0 | 4.1 | 49.2 | 10.0 | 4g |
| Ball phantom | 2. Full FOV* | 36 | 3.0 | 4.1 | 49.2 | 10.0 | 4i, j |
| Res phantom | 1. Full FOV | 20 | 0.6 | 25.8 | 361.2 | 10.0 | 4c, d |
| Res phantom | 2. Full FOV* | 20 | 0.6 | 25.8 | 361.2 | 10.0 | 4e, f |
| Res phantom | 3. rFOV* | 20 | 0.6 | 5.3 | 74.2 | 10.0 | 4h |
| DAo | 1. Full FOV | 32 | 2.0 | 6.1 | 85.4 | 10.0 | 5a, b |
| DAo | 2. Full FOV* | 32 | 2.0 | 6.1 | 85.4 | 10.0 | 5c, d |
| DAo | 3. rFOV* | 16 | 2.0 | 2.5 | 35 | 10.0 | 5e |
| DAo | 4. rFOV* | 16 | 1.15 | 5.7 | 79.8 | 10.0 | 5f |
| RCA | 1. Full FOV | 26 | 0.8 | 28.4 | 454.4 | 7.5 | 6a, b |
| RCA | 2. Full FOV* | 26 | 0.8 | 28.4 | 454.4 | 7.5 | 6c, d |
| RCA | 3. rFOV* | 13 | 0.8 | 7.1 | 113.6 | 7.5 | 6e |
| RCA | 4. rFOV* | 13 | 0.4 | 25.2 | 403.2 | 15 | 6f |

A * indicates that OVS preparation was used. All experiments used 16 spiral shots, 50° flip angle and TE = 2.0 mec, and TR = 750-1000 msec, depending on R-R interval.

For the DAo scans, the OVS passband was scaled to 9 cm to capture the vena cava. For coronary artery imaging, the diastolic quiescent period was located with cine imaging prior to data collection and respiratory motion was controlled with end-exhalation breath holds. The cross-sectional coronary artery images were reconstructed with frequency-segmented off resonance compensation, see Noll D C, Meyer C H, Pauly J M, Nishimura D G, Macovski A, *A homogeneity correction method for magnetic resonance imaging with time-varying gradients*, IEEE Trans Med Imaging 1991, No. 10(4):629-637, using 3.0 mm resolution field maps also acquired during the scan. Data were gridded with measured k-space trajectories, see Duyn J H, Yang Y, Frank J A, van der Veen J W, *Simple correction method for k-space trajectory deviations in MRI*, J Magn Reson 1998, No. 132(1):150-153, to reduce artifacts due to inaccurate generation of the gradient fields.

Results

The OVS performance measures for each phantom and in vivo experiment are listed in Table 2:

TABLE 2

| Subject | Acquisition type | Expected relative SNR | Expected relative SNR (incl. $T_2$) | Stop-band atten | SNR | Relative efficiency | Relative efficiency (incl. $T_2$) |
|---|---|---|---|---|---|---|---|
| Ball phantom | 1. Full FOV | — | — | — | 65.6 | — | — |
| Ball phantom | 2. Full FOV* | 1.0 | 0.83 | 95% | 53.1 | 81% | 98% |
| DAo | 1. Full FOV | — | — | — | 45.2 | — | — |
| DAo | 2. Full FOV* | 1.0 | 0.98 | 90% | 39.7 | 88% | 90% |
| DAo | 3. rFOV* | 0.64 | 0.63 | — | 21.3 | 74% | 75% |
| DAo | 4. rFOV* | 0.32 | 0.31 | — | 11.6 | 80% | 83% |
| RCA | 1. Full FOV | — | — | — | 22.8 | — | — |
| RCA | 2. Full FOV* | 1.0 | 0.87 | 85% | 16.2 | 71% | 82% |
| RCA | 4. rFOV* | 0.50 | 0.43 | — | 7.7 | 68% | 79% |
| RCA | 3. rFOV* | 0.47 | 0.41 | — | 7.1 | 66% | 76% |

The expected SNR factor is relative to the full FOV baseline scans without OVS.

A * indicates OVS preparation was used.

Intrinsic $T_2$ attenuation during the OVS sequence was assessed using the specified values for the phantoms and nominal $T_2$ values of 275 msec for blood in the DAo [19] and 40 msec for tissues surrounding the RCA [20]. From Bloch simulation, the effective transverse duration time T for the tipdown and tipback pulses has been measured to be 5.2 msec and 350 μsec, respectively. Thus the intrinsic passband signal loss including the 120 μsec interpulse hardware delay is $\exp(-5.67/T_2^*)$ for $T_2^*$ in milliseconds.

For the ball phantom, the measured $B_1+$ scale in the 5 cm passband was 0.90±0.11. The OVS stopband attenuation was 95%, and the relative efficiency was 81%. When intrinsic $T_2$ decay was considered, the efficiency was 98%. Images from both phantoms are shown in FIG. 4.

FIGS. 4A-4J illustrate OVS performance in phantoms. Ball phantom images with the OVS tipback gradients scaled to show the structure of the I (A) and Q (B) signals, acquired by selectively tuning the tipback pulse RF phase. Resolution phantom images with a full FOV before (C, D) and after (E, F) OVS preparation, and with a rFOV (H) at the same prescribed resolution. Off resonance blurring artifacts are not evident in the rFOV image. Ball phantom images with a full FOV before (G) and after (I, J) OVS preparation. Image (J) is 5× clipped to show the noise floor.

Figure 4A:
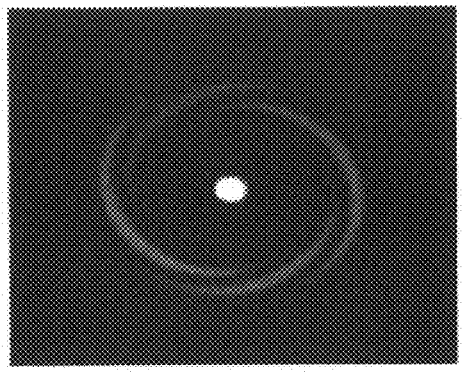
FIGS. 4A-4J illustrate OVS performance in phantoms.
Figure 4C:
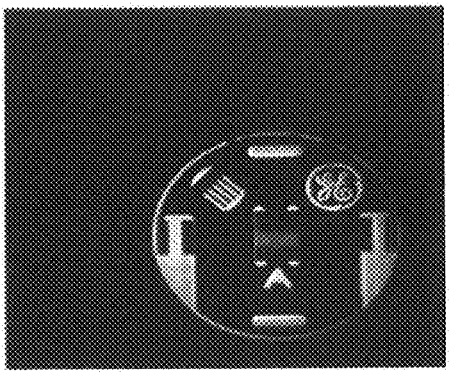
Figure 4B:
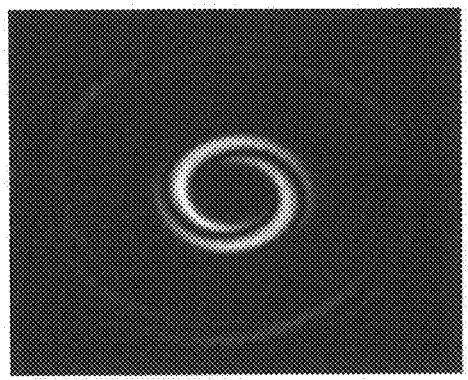
Figure 4D:
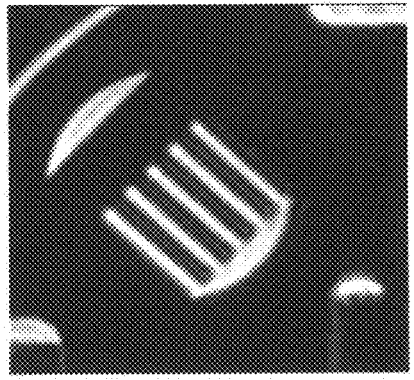
Figure 4E:
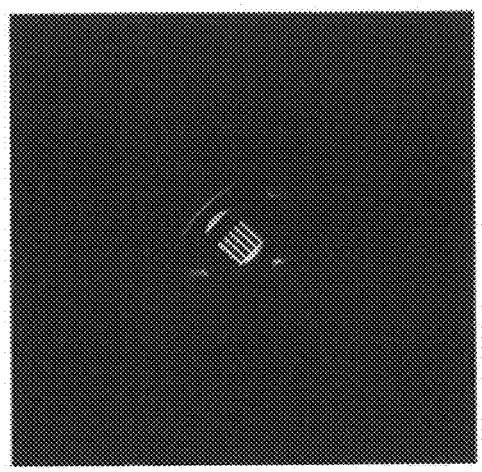
Figure 4G:
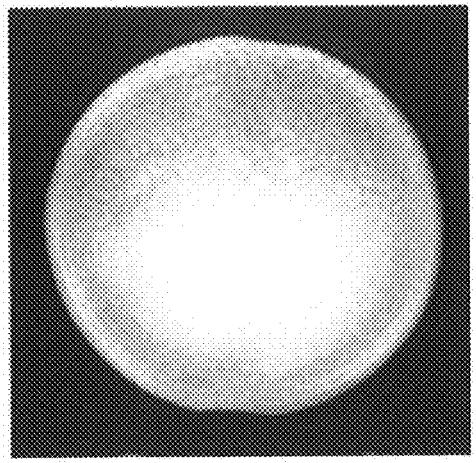
Figure 4F:
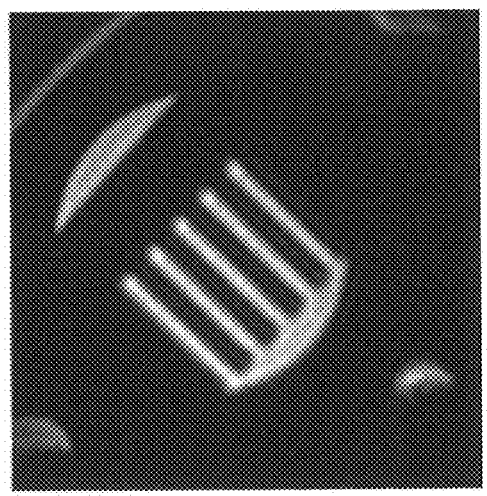
Figure 4H:
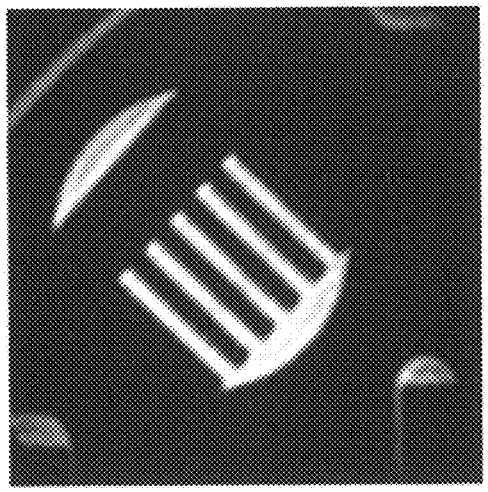
Figure 4I:
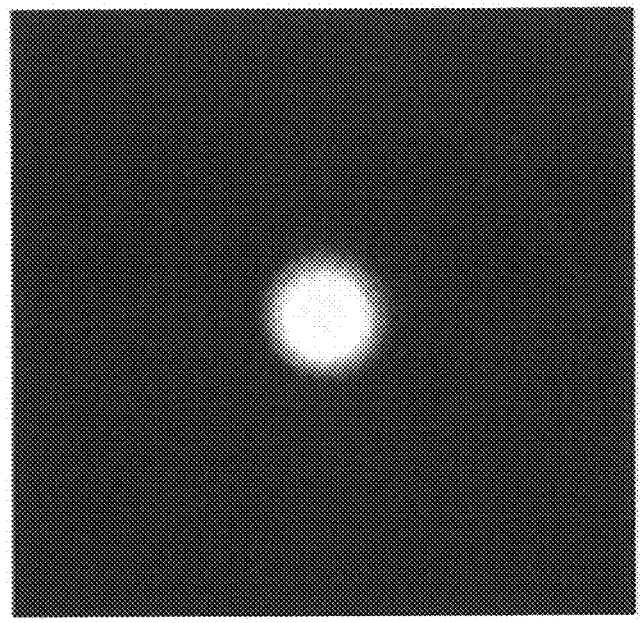
Figure 4J:
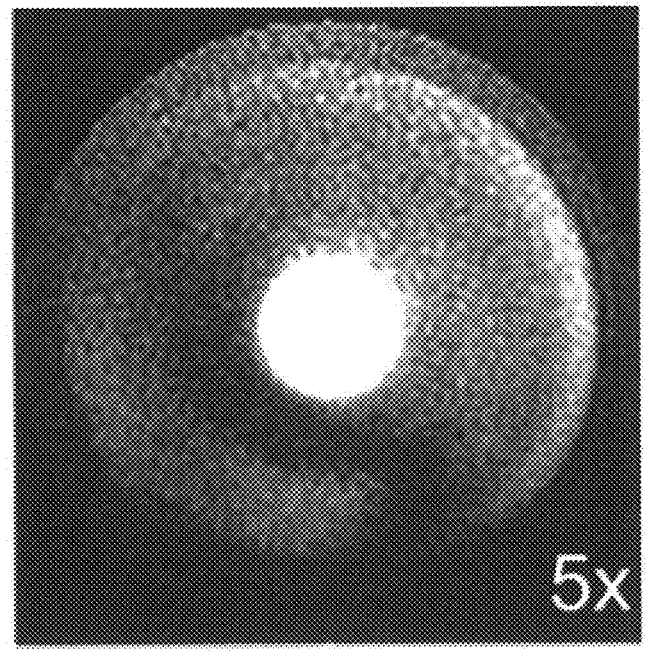

FIGS. 4A and 4B show the I and Q signals acquired with the OVS passband width scaled to 1.9 cm in order to demonstrate the effect of the conjugate symmetry constraint described in FIG. 3. For the resolution phantom, the rFOV image of the comb object (FIG. 4h) has less blurring as compared to the full FOV image (FIG. 4D), even though both have the same prescribed resolution.

For the DAo experiments, the measured $B_1+$ scale in the 9 cm passband was 0.82±0.24 across the three slices. The OVS stopband attenuation was 90%, and the relative efficiency was 88%, but 90% when $T_2$ decay was considered. Images from a representative slice are shown in FIG. 5. The rFOV images exhibit fewer artifacts, as seen around the vena cava, compared to the full FOV images.

FIG. 5A-5F illustrate OVS performance around the descending aorta. Images with a full FOV before (A, B) and after (C, D) OVS preparation, and with a rFOV (f) at the same prescribed resolution. A fine-resolution rFOV image (e) is also shown. Blurring and ringing artifacts around the vena cava (arrow) are less evident in both rFOV images. The Q signal (g), shown with 10× clipping, indicates that OVS calibration was successful and minimal passband signal was lost.

Figure 5A:
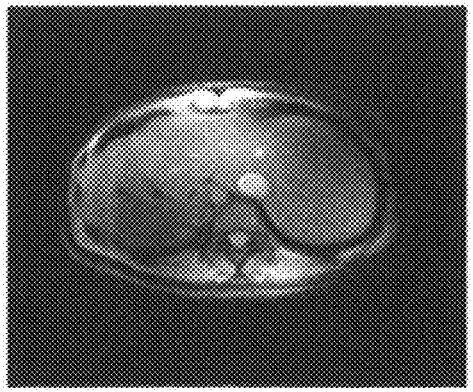
FIG. 5A-5G illustrate OVS performance around the descending aorta.
Figure 5C:
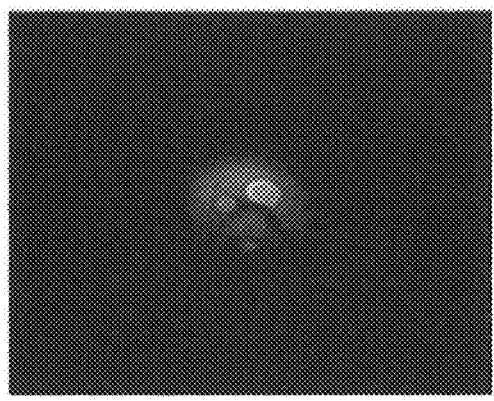
Figure 5B:
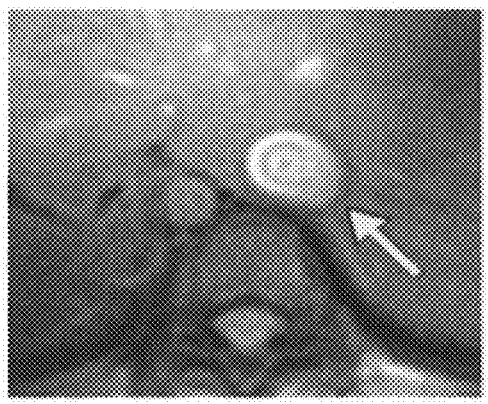
Figure 5D:
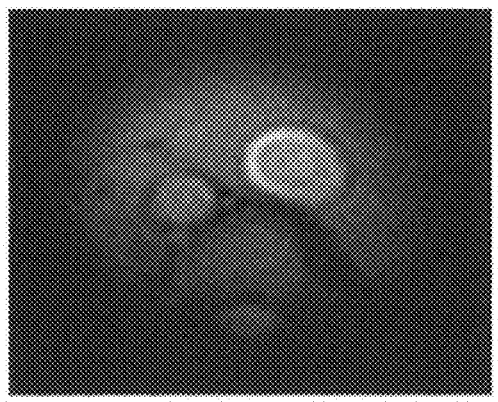
Figure 5E:
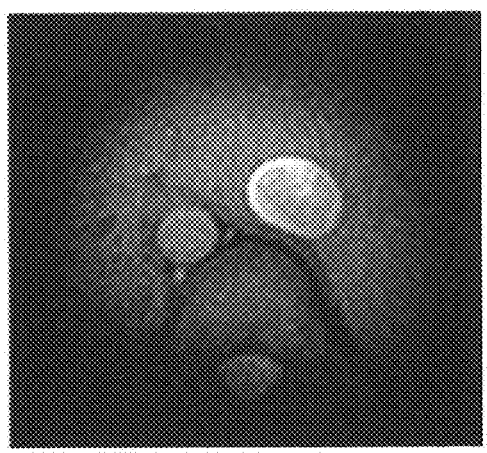
Figure 5G:
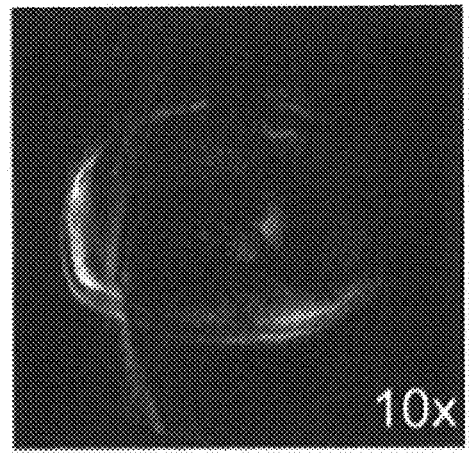
Figure 5F:
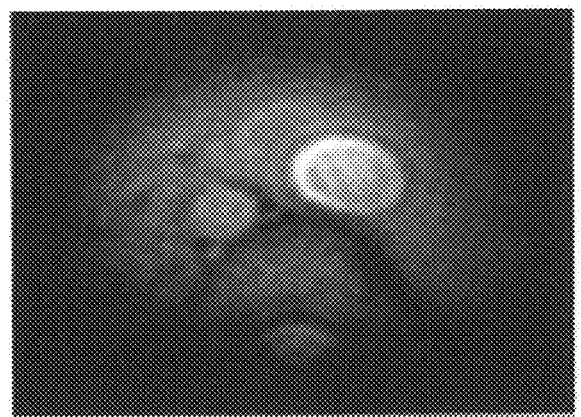

The accuracy of the OVS calibration is confirmed by the Q signal image (FIG. 5G), which shows little remaining passband energy compared to the I signal image (FIG. 5C).

For the RCA experiments, the measured $B_1+$ scale in the 5 cm passband was 0.72±0.25 across the three slices. The OVS stopband attenuation was 85%, and the relative efficiency was 71%, but 82% when $T_2$ decay was considered.

Figure 6A:
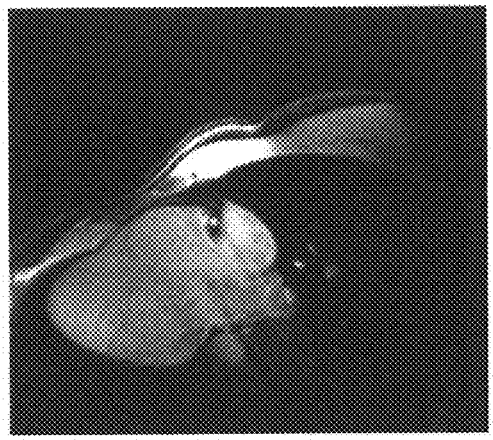
FIG. 6A-6F illustrate OVS performance with coronary artery imaging and off resonance correction.
Figure 6C:
Figure 6B:
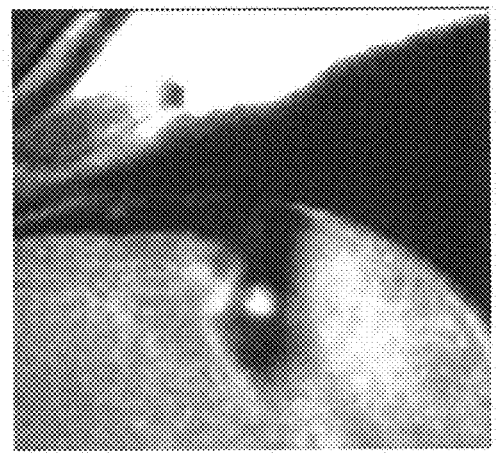
Figure 6D:
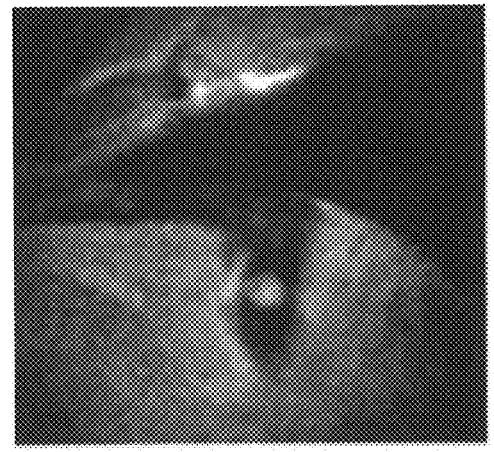
Figure 6E:
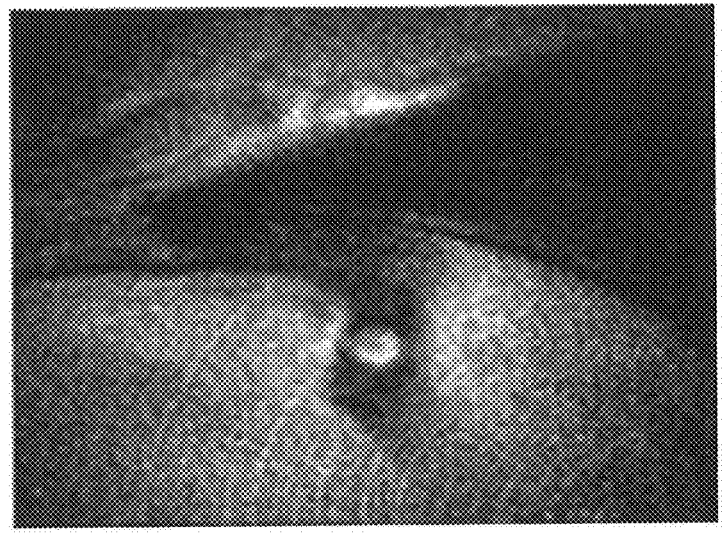
Figure 6F:
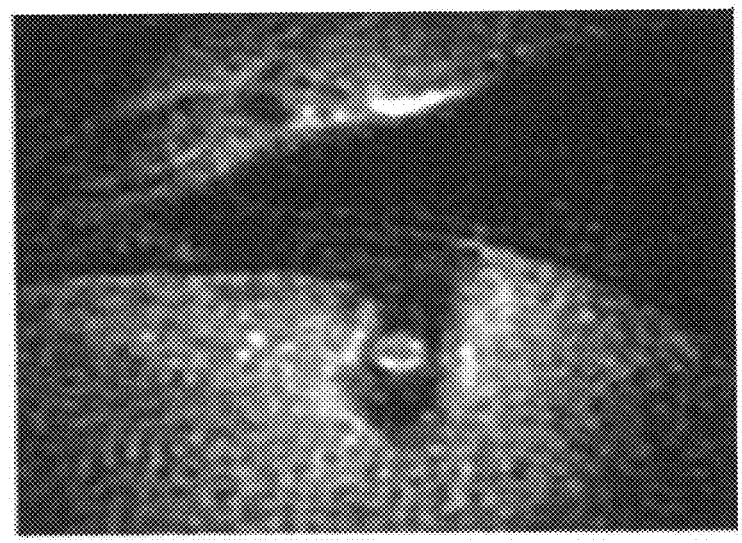

FIG. 6A-6F illustrate OVS performance with coronary artery imaging and off resonance correction. Images will a full FOV image before (A, B) and after (c,d) OVS preparation, and with a rFOV prescribed with the same (F) and finer (E) resolution. Images from a representative slice are shown in FIG. 6. The full FOV image (FIG. 6B) contains residual blurring artifacts which are not apparent in the rFOV image (FIG. 6F).

Discussion

OVS performance degrades when $B_1+$ scales are small (<0.3), the off resonance bandwidth is large (>300 Hz), or the tissue $T_2^*$ in the passband is short (<50 msec). Smaller scales limit the effectiveness of the tipdown and tipback pulses and cause greater dispersion of the passband transverse magnetization phase. Similarly, severe off resonance decreases the coherency between the transverse magnetization and the tipback pulse, causing the tipback of more Q signal and less I signal and, consequently, lower efficiency.

For these reasons, at field strengths higher than 3 T, the tipdown pulse may be re-optimized to balance phase coherence with pulse duration and intrinsic $T_2^*$ attenuation. Depending on the off resonance bandwidth, the delay between the tipdown and tipback pulses could be adjusted to improve the coherency. Optimizing this delay was investigated, but found through Bloch simulation and experimental testing that the performance benefits at 3 T were negligible. At higher magnet strengths with greater field inhomogeneities, this may have a more significant impact.

The subject OVS design is flexible and permits customization to many applications. A spiral tipback pulse makes the OVS ideally suited for polar trajectories; however a 1D tipback pulse could be used instead for $B_1+$-robust OVS in Cartesian acquisitions. The duration of the OVS sequence is clearly dominated by the BIR-4 tipdown pulse, which could be replaced by a shorter adiabatic pulse for faster OVS and less $T_2^*$ decay at the expense of $B_1+$ robustness and saturation bandwidth. Alternatively, to improve tolerance to $B_1+$ field variation, a longer BIR-4 pulse or a tailored saturation [21] sequence could be substituted. In these cases, the tipdown pulse parameters need to be chosen to maximize coherency and a new lookup table generated for OVS calibration.

The subject design is compatible with other magnetization preparation techniques. For preparation sequences applied prior to OVS, there may be no adverse interferences as long as all transverse magnetization is dephased before OVS begins. It may therefore be compatible with sequences such as adiabatic $T_2$ Prep, see Nezafat R, Stubar M, Ouwerkerk R, Gharib A M, Desai M Y, Pettigrew R I, B1-*insensitive T2 preparation for improved coronary magnetic resonance angiography at 3 T*, Magn Reson Med 2006, No. 55:858-864, and spatial and spectral pre-saturations. It may also be compatible with inversion preparations because inverted magnetization will assume the OVS spatial profile. Combining OVS with techniques such as double inversion black-blood preparation, see Edelman RR, Chien D, Kim D, *Fast selective black blood MR imaging*, Radiol 1991, No. 181 (3):655-660, may be effective for blood flowing through the cylindrical beam of the passband. For preparation sequences applied after OVS, shorter preparations may be recommended because the stopband suppression will abate according to $T_1$.

The OVS sequence may be valuable in other imaging protocols. Scan times may be reduced in navigated acquisitions with OVS. Navigators positioned outside the passband beam may be attenuated, but in a cardiac protocol, see Botnar R M, Stuber M, Kissinger K V, Kim W Y, Spuentrup E, Manning W J, *Noninvasive coronary vessel wall and plaque imaging with magnetic resonance imaging*, Circ 2000, No. 102(21):2582-2587, the R-R interval may provide time for the navigator signal to regenerate. In flow-sensitive spiral acquisitions, see Brandts A, Stijntje R D, Doornbos J, Weiss R G, de Roos A, Stuber M, Westenberg JJM, *Right coronary artery flow velocity and volume assessment with spiral k-space sampled breathhold velocity-encoded MRI at 3 Tesla: accuracy and repdoducibility*, J Magn Reson Imaging 2010, No. 31(5):1215-23, the OVS sequence may improve spatial resolution and velocity estimation accuracy. The 2D multi-slice imaging protocol can be extended to a 3D acquisition of the cylindrical passband volume. Because one logical gradient may be unused during the tipback pulse, profile variations along the cylinder may arise from spatially variant system imperfections. For real-time imaging, the OVS sequence could be applied at a frequency dictated by the local $T_1$ relaxation times. The high RF power of the BIR-4 pulse may have minimal effects when the applied once per R-R interval, as in this study. However, in other applications these effects may need further consideration when choosing the OVS repetition interval.

Figure 7:
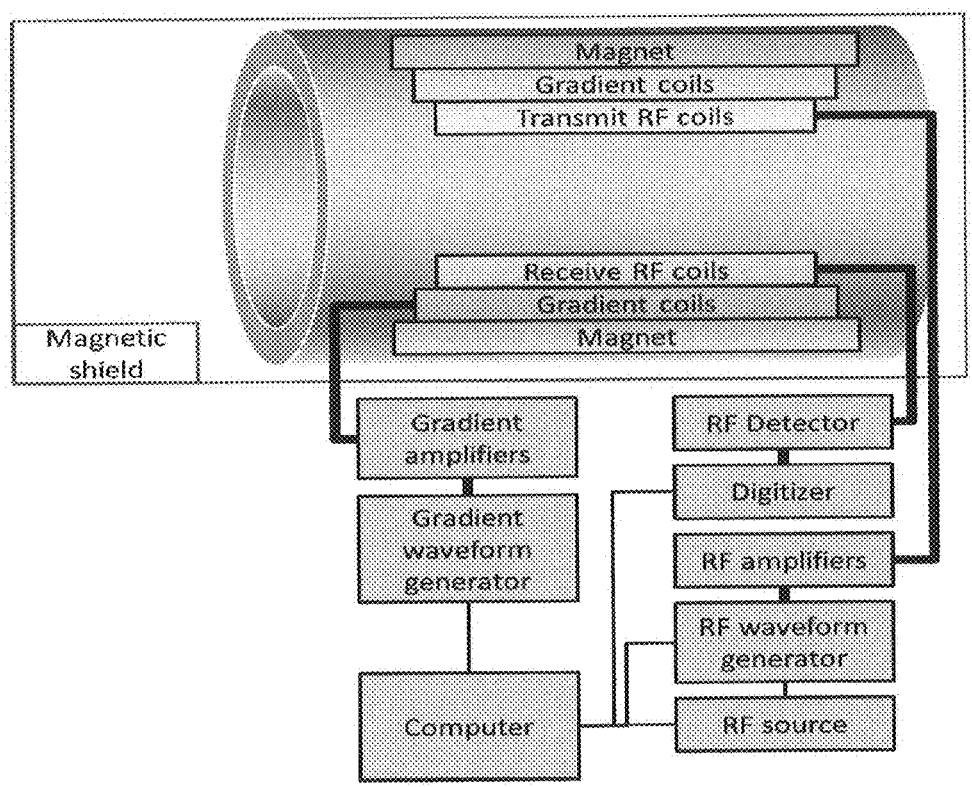
FIG. 7 illustrates an example of an MRI scanner.

FIG. 7 illustrates an example of an MRI scanner. As illustrated in FIG. 7, the scanner may include one or more magnets, gradient coils, transmit RF coils, gradient amplifiers, gradient waveform generators, RF detectors, digitizers, rf amplifiers, rf waveform generators, an RF source, magnetic shielding, and a computer.

The RF coils may be configured to transmit and thereby creates a radio frequency-modulated magnetic field. The RF coils may also be configured to receive and thereby converts an MR signal from the subject or sample into a current.

The RF detector may be configured to demodulate the received RF signal to baseband and to amplify the demodulated signal.

The digitizer may be configured to converts the analog received baseband signal into a digital signal.

The RF source may be configured to generate an RF carrier frequency.

The RF waveform generator may be configured to generate the waveforms for the transmit RF coils, convert them from digital signals to analog signals, and to modulate them with the RF carrier frequency.

The RF amplifiers may be configured to amplify the analog waveforms for the transmit RF coils.

The gradient waveform generator may be configured to generates the waveforms for the gradient coils and to convert them from digital signals to analog signals.

The gradient amplifiers may be configured to amplify the analog gradient waveforms.

The gradient coils may be configured to create weak, space-varying magnetic fields from the analog gradient waveforms.

The computer may be a system of one or more computers and may be configured to controls the waveform generators and RF source so as to cause them to generate one or more of the signals that have been discussed herein to achieve one or more of the results discussed herein. The computer may be configured to receive data from the digitizer and processes it and to provide a user interface for the MRI scanner operator.

The computer may include non-transitory, tangible, computer-readable storage media, such as a hard disk drive, CD ROM, and/or flash memory, that contains a program of instructions that cause the computer to perform one or more of the operations that are describe herein.

The magnetic shielding may limits the extent of the magnet's fringes field and to protect the scanner from external magnetic fields.

Conclusions

The subject design is for 2D outer volume suppression and rFOV imaging at 3 T. The subject design may have a short duration, yet may still be robust to $B_1+$ attenuation. A solution to the Bloch equations has been developed using a small-tip angle approximation for transverse initial conditions, and the solution to describe a general relationship between the spatial profiles of tipback pulses and conventional tipdown pulses has been formulated. This relationship explains a unique property of spiral tipback pulses: single-shot pulses may have the equivalent performance of two-shot pulses. The duration of the OVS sequence was kept to a minimum by exploiting this property. There was some loss of efficiency with the sequence, but for the cardiovascular imaging scenarios they were considered this was acceptable. Possible advantages of rFOV imaging have been demonstrated, including reduced image artifacts and the ability to both prescribe and achieve finer spatial resolutions. The flexibility of the design permits a tradeoff between duration and SNR performance, and may be suitable for real-time imaging.

Additional Information

Analysis of Small-tip Pulses with Transverse Initial Magnetization

A general relationship between the magnetization spatial profiles of tipdown and tipback pulses with small flip angles may be formulated. A similar analysis can be performed for frequency-selective and other types of pulses. The superscripts d and b may be used to refer to the tipdown and tipback scenarios, respectively. Complex transverse magnetizations and RF waveforms are denoted as $M_{xy}=M_x+jM_y$ and $B_1=B_{1,x}+jB_{1,y}$. When relaxation is ignored, the Bloch equations in the rotating frame are $$\dot{M}_{xy}=-j\gamma(r\cdot G)M_{xy}+j\gamma M_z B_1 \text{ and} \quad [A1]$$

$$\dot{M}_z=\gamma B_{1,y}M_x-\gamma B_{1,x}M_y=-\gamma Im\{B_1^* M_{xy}\}, \quad [A2]$$

where * denotes complex conjugation.

In a conventional tipdown or excitation scenario, a pulse of duration T with RF waveform $B_1(t)$ and gradient waveform $G(t)$ is applied to a spin system with longitudinal initial magnetization $M_o$. The spatial profile of the final transverse magnetization $M_{xy}^d(r)$ is formulated by solving the Bloch equations assuming a small flip angle so that $M_z^d \approx M_o$. The resulting spatial profile is $$M_{xy}^d(r)=j\gamma M_o \int_0^T B_1(\tau)e^{jr\cdot k^d(\tau)}d\tau, \quad [A3]$$

where $k^d(t)=-\gamma\int_t^T G(s)ds$ is the conventional excitation k-space coordinate [10].

In the tipback scenario, the initial magnetization is transverse and the spatial profile of the final longitudinal magnetization $M_z^b(r)$ is desired. Define the initial magnetization to be $M_o e^{j\theta_o}$ with $\theta_o$ increasing counter-clockwise from $\hat{x}$. In a manner similar to the conventional small-tip approximation, we assume the tipback pulse rotates the magnetization vector out of the transverse plane by only a small amount so that $|M_{xy}^b|\approx M_o >> M_z^b$. Equation [A1] then decouples from Eq. [A2], and the solution to Eq. [A1] at time T becomes $$M_{xy}^b(r) \approx M_o e^{j\theta_o}e^{jr\cdot k_c}, \quad [A4]$$

where $k_c=-\gamma\int_0^T G(s)ds$. The desired spatial profile of the tipback pulse is found by solving the system in Eqs. [A2] and [A4], which yields $$M_z^b(r)=-\gamma M_o Im\{e^{j\theta_o}\int_0^T B_1^*(\tau)e^{jr\cdot k^b(\tau)}d\tau\}, \quad [A5]$$

where $k^b(t)=-\gamma\int_0^t G(s)ds$. Note that $k_c=k^b(t)+k^d(t)$.

If the tipback pulse has waveforms $B_1(t)$ and $G(t)$ identical to the tipdown pulse, then the spatial profiles $M_z^b(r)$ and $M_{xy}^d(r)$ can be related. Substituting Eq. [A3] into Eq. [A5] yields $$M_z^b(r)=-\cos(\theta_o+r\cdot k_c)M_x^d(r)-\sin(\theta_o+r\cdot k_c)M_y^d(r) \quad [A6]$$

The undesired spatial modulation can be removed by instead using waveforms $-B_1(T-t)$ and $G(T-t)$ for the tipback pulse. Ignoring effects from relaxation and off resonance, these waveforms correspond to a direct reversal of the tipdown rotation process. With these waveforms, the spatial profile becomes $$M_z^b(r)=\cos(\theta_o)M_x^d(-r)+\sin(\theta_o)M_y^d(-r). \quad [A7]$$

The space-reversal can be removed by using waveforms $-B_1^*(T-t)$ and $G(T-t)$, which yields $$M_z^b(r) = -\cos\theta_o M_x^d(r) + \sin\theta_o M_y^d(r). \quad [A8]$$

The modulation and space-reversal could also be removed from Eq. A6 by redesigning the pulse so that $k_c=0$.

This defines the general relationship between the tipdown and tipback scenarios for any small-tip pulse. When the initial magnetization is transverse, the final longitudinal magnetization is a weighted sum of the components of the final transverse magnetization had the initial magnetization been longitudinal. FIG. 3 illustrates this relationship for spiral pulses.

List of Symbols

| Symbol | Main | Subscript | Superscript |
|---|---|---|---|
| $B_1$ | Italic upper case 'bee' | one | |
| $B_1^*$ | Italic upper case 'bee' | one | asterisk |
| $B_{1,x}, B_{1,y}$ | Italic upper case 'bee' | one, Italic x<br>one, Italic y | |
| $G$ | Italic bold upper case 'gee' | | |
| $\gamma$ | Italic gamma | | |
| $k^b$ | Italic bold 'kay' | | Italic bold 'bee' |
| $k^d$ | Italic bold 'kay' | | Italic bold 'dee' |
| $k_c$ | Italic bold 'kay' | Italic bold 'cee' | |
| $M_o$ | Italic upper case 'em' | Italic 'oh' | |
| $M_x, M_y, M_z$ | Italic upper case 'em' | Italic x<br>Italic y<br>Italic z | |
| $M_x^b, M_x^d$ | Italic upper case 'em' | Italic x | Italic b<br>Italic d |
| $M_y^b, M_y^d$ | Italic upper case 'em' | Italic y | Italic b<br>Italic d |
| $M_z^b, M_z^d$ | Italic upper case 'em' | Italic z | Italic b<br>Italic d |
| $M_{xy}$ | Italic upper case 'em' | Italic xy | |
| $M_{xy}^b, M_{xy}^d$ | Italic upper case 'em' | Italic xy | Italic b<br>Italic d |
| $\dot{M}_{xy}$ | Italic upper case 'em' with a dot over it | Italic xy | |
| $\dot{M}_z$ | Italic upper case 'em' with a dot over it | Italic z | |
| $r$ | Italic bold 'are' | | |
| $s, t, T$ | Italic 'ess'<br>Italic 'tee'<br>Italic upper case 'Tee' | | |
| $\hat{x}$ | Italic 'ex' hat | | |
| $\theta_o$ | Italic theta | Italic 'oh' | |

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and advantages. These also include embodiments in which the components and/or steps are arranged and/or ordered differently.

For example, the OVS spatial saturation pulse sequence could be altered to create a spectral saturation sequence or a spatial-spectral saturation sequence by modifying the tip-back pulse gradient and RF waveforms while still benefiting from the conjugate symmetry property of tip-back pulses.

Other examples include replacing the tip-down pulse and dephasing gradients. The tip-down pulse can be any pulse robust to field inhomogeneity and can be non-selective or selective. The 8.0 millisecond tip-down pulse that has been discussed could be shortened or lengthened to trade speed with robustness. The dephasing gradients at the end of the pulse sequence can be replaced with other spoiling techniques or removed altogether.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A Magnetic Resonance Imaging (MRI) scanner comprising:
   one or more gradient waveform generators that generate one or more gradient waveforms;
   an RF waveform generator that generates an RF waveform; and
   a processor that controls the one or more gradient waveform generators and the RF waveform generator to generate a magnetization saturation preparation pulse sequence that includes:
   a non-selective adiabatic tip-down pulse that is insensitive to RF field inhomogeneity, and followed by
   a two-dimensional (2D) spatially selective tip-back pulse that employs a conjugate symmetry constraint in its energy spectrum.

2. The MRI scanner of claim 1, wherein the 2D spatially selective tip-back pulse has a duration of no more than 12.5 milliseconds with a two-sided stopband width of 44.0 centimeters and a two-sided passband width of 5.0 centimeters.

3. The MRI scanner of claim 1, wherein the processor controls the one or more gradient waveform generators and the RF waveform generator to produce a spectrally selective tip-back pulse that has the conjugate symmetry constraint in its energy spectrum.

4. The MRI scanner of claim 3, wherein the processor controls the one or more gradient waveform generators and the RF waveform generator to produce a spatially selective tip-back pulse that has the conjugate symmetry constraint in its energy spectrum.

5. The MRI scanner of claim 1, wherein the magnetization saturation preparation pulse sequence limits a signal producing region for imaging.

6. The MRI scanner of claim 1, wherein the two-dimensional (2D) spatially selective tip-back pulse is defined by a predetermined duration, a predetermined two-sided stopband width and a predetermined two-sided passband width.

7. The MRI scanner of claim 1, wherein the non-selective adiabatic tipdown pulse has an angle of approximately 90 degrees and the two-dimensional spatially selective tipback pulse has an angle of approximately −90 degrees.

8. The MRI scanner of claim 1, further comprising:
   gradient amplifiers that each amplify one of the one or more gradient waveforms;
   gradient coils that each generate a magnetic field based on an amplified gradient waveform;
   an RF amplifier that amplifies the RF waveform;
   a first RF coil that transmits the amplified RF waveform;
   a superconducting magnet that generates a detectable signal;
   a second RF coil that receives the detectable signal;
   an RF detector that detects the detectable signal received by the second RF coil; and
   a digitizer that digitizes the detected signal.

9. A non-transitory computer-readable storage media encoded with a computer program, the program comprising instructions that when executed by a processor within a Magnetic Resonance Imaging (MRI) scanner cause the processor to perform operations comprising:
   controlling one or more gradient waveform generators and a Radio Frequency (RF) waveform generator to generate a magnetization saturation preparation pulse sequence, the magnetization saturation preparation pulse sequence having:
   a non-selective adiabatic tip-down pulse that is insensitive to RF field inhomogeneity, and followed by
   a two-dimensional (2D) spatially selective tip-back pulse that employs a conjugate symmetry constraint in its energy spectrum.

10. The non-transitory computer-readable storage media of claim 9, wherein the 2D spatially selective tip-back pulse has a duration of no more than 12.5 milliseconds with a two-sided stopband width of 44.0 centimeters and a two-sided passband width of 5.0 centimeters.

11. The non-transitory computer-readable storage media of claim 9, wherein the operations include controlling the one or more gradient waveform generators and the RF waveform generator to produce a spectrally selective tip-back pulse that has the conjugate symmetry constraint in its energy spectrum.

12. The non-transitory computer-readable storage media of claim 11, wherein the operations include controlling the one or more gradient waveform generators and the RF waveform generator to produce a spatially selective tip-back pulse that has the conjugate symmetry constraint in its energy spectrum.

13. The non-transitory computer-readable storage media of claim 9, wherein the magnetization saturation preparation pulse sequence limits a signal producing region for imaging.

14. The non-transitory computer-readable storage media of claim 9, wherein the two-dimensional (2D) spatially selective tip-back pulse is defined by a predetermined duration, a predetermined two-sided stopband width and a predetermined two-sided passband width.

15. The non-transitory computer-readable storage media of claim 9, wherein the non-selective adiabatic tipdown pulse has an angle of approximately 90 degrees and the two-dimensional spatially selective tipback pulse has an angle of approximately −90 degrees.

16. A method for limiting a signal producing region for imaging, comprising:
   generating, using at least one of a gradient waveform generator or Radio Frequency (RF) waveform generator, a magnetization saturation preparation pulse sequence that has:
   a non-selective adiabatic tip-down pulse that is insensitive to RF field inhomogeneity, followed by
   a two-dimensional (2D) spatially selective tip-back pulse that employs a conjugate symmetry constrint in its energy spectrum, and
   one or more soiler gradients to dephase a transverse signal outside the region of interest; and
   limiting the signal producing region using the generated magnetization saturation preparation pulse sequence.

17. The method of claim 16, wherein the non-selective adiabatic tipdown pulse has an angle of approximately 90 degrees and the two-dimensional spatially selective tipback pulse has an angle of approximately −90 degrees.

18. The method of claim 16, wherein the two-dimensional (2D) spatially selective tip-back pulse is defined by a predetermined duration, a predetermined two-sided stopband width and a predetermined two-sided passband width.

19. The method of claim 16, wherein generating the magnetization saturation preparation pulse sequence includes generating a spectrally selective tip-back pulse that has the conjugate symmetry constraint in its energy spectrum.

* * * * *